United States Patent
Kaku et al.

(10) Patent No.: US 6,492,707 B1
(45) Date of Patent: Dec. 10, 2002

(54) SEMICONDUCTOR INTEGRATED CIRCUIT DEVICE WITH PAD IMPEDANCE ADJUSTMENT MECHANISM

(75) Inventors: Mariko Kaku, Yokohama (JP); Kazuhide Yoneya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/217,338

(22) Filed: Dec. 21, 1998

(30) Foreign Application Priority Data

Dec. 22, 1997 (JP) .............................................. 9-352756

(51) Int. Cl.⁷ .............................................. H01L 29/00
(52) U.S. Cl. ........................................ 257/531; 257/277
(58) Field of Search ................................ 257/532, 536, 257/691, 699, 531, 533, 784, 277

(56) References Cited

U.S. PATENT DOCUMENTS

| | | | |
|---|---|---|---|
| 5,557,138 A | * | 9/1996 | Ikeda et al. .................. 257/531 |
| 5,610,433 A | * | 3/1997 | Merrill et al. ............... 257/531 |
| 5,629,553 A | * | 5/1997 | Ikeda et al. .................. 257/531 |
| 6,072,205 A | * | 6/2000 | Yamaguchi et al. ......... 257/277 |

FOREIGN PATENT DOCUMENTS

JP         03-019358 A        1/1991

* cited by examiner

*Primary Examiner*—Phat X. Cao
(74) *Attorney, Agent, or Firm*—Hogan & Hartson, LLP

(57) ABSTRACT

A semiconductor integrated circuit device, which enables impedance adjustment of a particular pad without affecting other pads or signal wirings or without the need for a design change in basic layout, has formed a number of elements and wirings on and in a silicon substrate 11, and pads 13 stacked thereon via an insulation film 12. A particular pad 13*a* is connected to a signal wiring 17*a* formed in a bus line region 17, and a capacitor-forming conductor 14 behaving as an impedance adjusting conductor is formed to surround the pad 13*a*. A source line conductor 15 is made in a space between the pad 13*a* and the capacitor-forming conductor 14 to encircle the capacitor-forming conductor 14. Therefore, the pad capacitance can be increased by using the space around the pad 13*a*, other signal wirings 17*b* and any others formed in the bus line region 17 are not affected substantially. Since here is used the portion around the pad which is not used normally, the basic layout need not be changed.

5 Claims, 11 Drawing Sheets

SECOND LAYER

FIRST LAYER

SEMICONDUCTOR INTEGRATED CIRCUIT DEVICE WITH PAD IMPEDANCE ADJUSTMENT MECHANISM

FIELD OF THE INVENTION

This invention relates to a semiconductor integrated circuit device (LSI) and, more particularly, to a mode of adjustment of the impedance of a pad for connecting a signal wiring on an LSI chip to an external pin.

DESCRIPTION OF THE PRIOR ART

Impedances of input/output pins of LSIs are determined by capacitances and resistances of wirings outside their packages, lead frames, gold bonding, pads on the LSI chips and signal wirings connected to the pads. Impedances determine propagation speeds, noises, waveform distortions, and so on, of input signals. In terms of the signal speed, capacitance and resistance had better be small. However, certain capacitance and resistance are required from the viewpoint of countermeasures against noises. Therefore, capacity and resistance of an input/output pin are designed to realize users' desired input/output characteristics, taking these requirements into consideration. Pads on LSI chips and signal wirings connected thereto are portions permitting ample freedom for adjustment of capacitance and resistance of input/output pins. However, as LSIs are large-scaled while miniaturizing their elements and wirings and increasing their density, adjustment of impedances of pads and signal wirings on LSIs are getting difficult.

This is explained below by way of a specific example. FIG. 13 shows a layout of a DRAM chip. The DRAM chip 1 has formed four divisional memory cell blocks 2, for example, as illustrated. Each memory cell block 2 includes a column decoder 3 and a row decoder 4 along inner edges thereof. The region between right and left memory cell blocks 2 is used to locate a peripheral circuit formed in region 7. The region between upper and lower memory cell blocks 2 is used to locate a peripheral circuit formed in region 5, and it is also used to make bus lines 8 such as address bus, data bus, and so forth, and pads 6 for externally drawing signal lines as shown in FIG. 14 in an enlarged scale.

In the LSI where bus lines 8 are closely packed near the alignment of pads 6, it is difficult to adjust impedance of a single pad 6 without affecting a signal wiring connected to another pad.

Assume here, for example, that when it is desired to add a capacity to a certain single pad 6, a capacitor 9 connected to a signal line 8a extending to a certain pad 6 is provided as shown in FIG. 15. The capacitor 9 is buried, for example, under signal lines 8a through 8c to electrically isolate it via an insulation film in order not to prevent signals from travelling in adjacent signal lines 8b and 8c. Nevertheless, capacitance coupling still occurs between signal lines 8b, 8c adjacent to the signal line 8a and the capacitor 9, and capacitance inevitably increases in the signal lines 8b and 8c.

Also, assume that a resistor-forming conductor 10 bent as shown in FIG. 16, for example, is provided to insert a resistor between the pad 6 and the signal line 8a connected thereto. Here again, useless capacitance coupling inevitably occurs respectively between it and other signal lines 8b, 8c located nearby. Usually, a high-density LSI, as referred to above, does not have an ample space for making such a resistor-forming conductor 10. If such a resistor-forming conductor 10 is nevertheless made there, other signal wirings in a common layer cannot be extended in that portion. That is, the adjusting mode as shown in FIG. 16 needs an essential change in layout of elements and wirings.

As explained above, it has been difficult to adjust impedance of a certain pad in a high-density LSI chip without affecting impedances and positions of other pads and signal lines or without changing the basic design of layout.

SUMMARY OF THE INVENTION

It is therefore an object of the invention to provide a semiconductor integrated circuit device enabling adjustment of the impedance of a certain pad without affecting characteristics and locations of other pads and signal wirings and without inviting a design change in essential layout.

According to the invention, there is provided a semiconductor integrated circuit device including semiconductor elements, signal wirings and pads formed on a semiconductor substrate so as to connect particular one of the semiconductor elements to particular one of the signal wirings and connect the particular signal wiring to particular one of the pads, comprising:

a capacitor-forming conductor made in a top layer to surround the particular pad and connected to the particular pad; and a first capacitance coupling conductor made in the top layer between the particular pad and the capacitor-forming conductor and brought into capacitance coupling with the particular pad and the capacitor-forming conductor, respectively.

According to the invention, there is further provided a semiconductor integrated circuit device comprising:

semiconductor elements, signal wirings and pads formed on a semiconductor substrate so as to connect particular one of the semiconductor elements to particular one of the signal wirings and connect the particular signal wiring to particular one of the pads; and a resistor-forming conductor connected between the particular signal wiring and the particular pad.

According to the invention, there is further provided a semiconductor integrated circuit device comprising:

semiconductor elements, signal wirings and pads formed on a semiconductor substrate so as to connect particular one of the semiconductor elements to particular one of the signal wirings and connect the particular signal wiring to particular one of the pads;

a fist capacitance-coupling conductor made under the particular pad via an insulation film;

a capacitor-forming conductor made under the capacitance-coupling conductor via an insulation film and connected to the particular pad; and a second capacitance-coupling conductor made under the capacitor-forming conductor via an insulation film and connected to the first capacitance-coupling conductor.

According to the invention, there is further provided a semiconductor integrated circuit device having formed on a semiconductor substrate a plurality of elements, signal wirings connecting these elements, and a plurality of pads for connecting desired one or more of the signal wirings to one or more external pins, comprising:

at least one impedance adjusting conductor pattern made to surround particular one of the pads and connected to the particular pad.

The impedance adjusting conductor pattern may be a capacitor-forming conductor, and a source line conductor may be made to encircle the capacitor-forming conductor and get into capacitance coupling with the capacitor-forming conductor and the pad.

DETAILED DESCRIPTION OF THE PREFERRED EMBODIMENTS

Embodiments of the invention applied to DRAMs are explained below with reference to the drawings.

Figure 1:
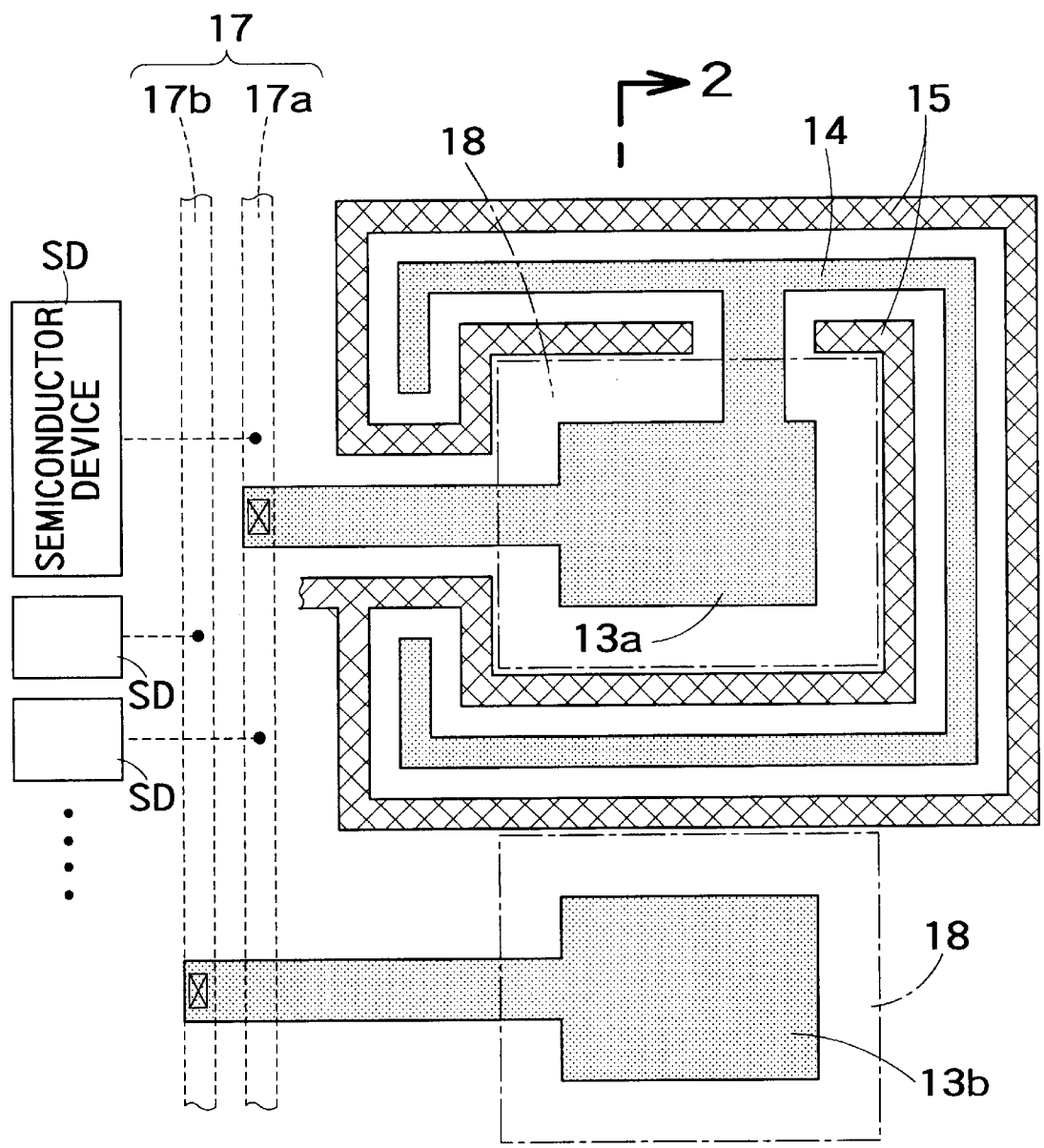
FIG. 1 is a diagram showing a pattern of conductors around a pad in a DRAM chip according to an embodiment of the invention.
Figure 2:
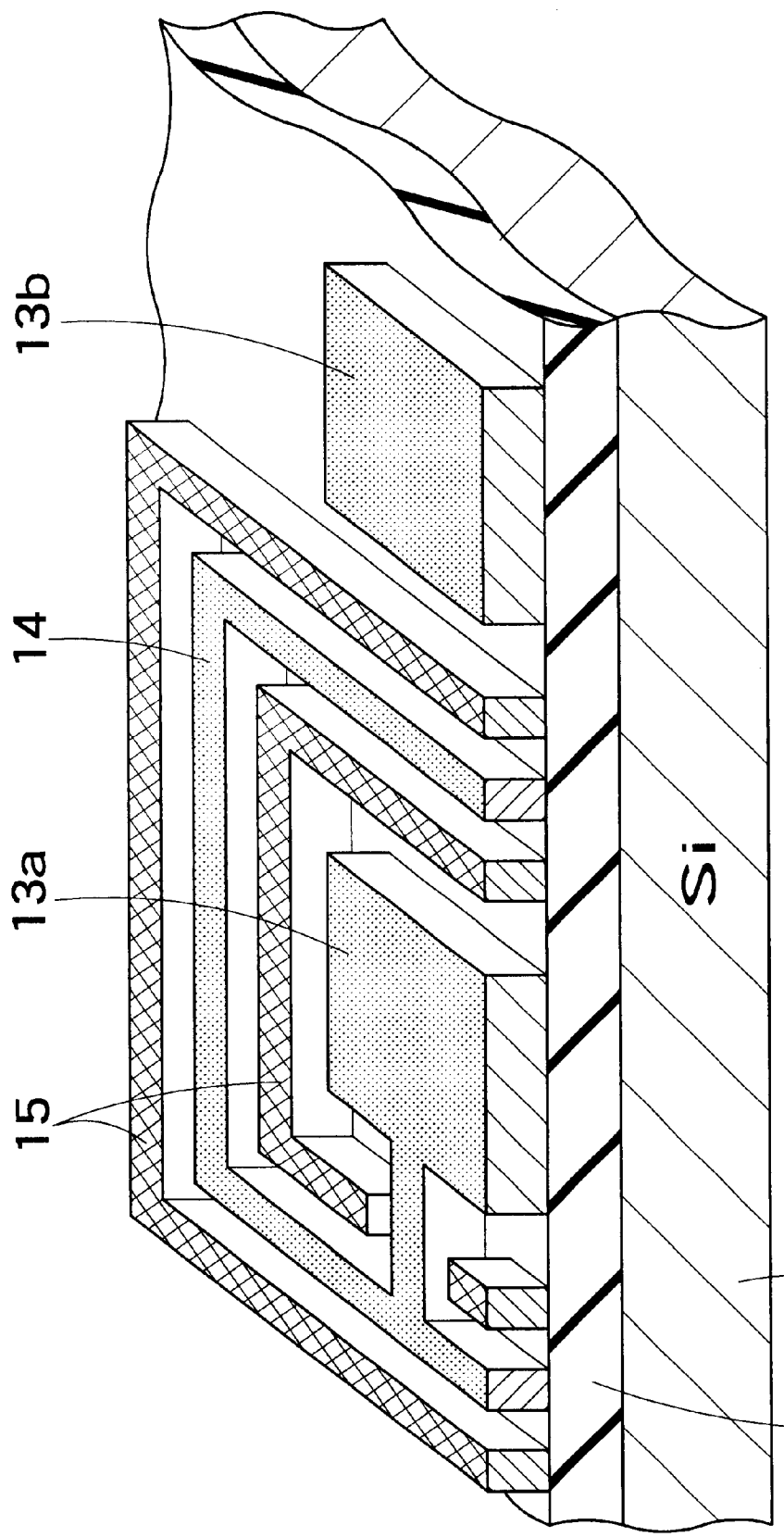
FIG. 2 is a perspective view of the structure of FIG. 1 from which a part thereof is cut off along the 2-2 line of FIG. 1.

FIG. 1 shows a layout of the pad portion in a DRAM chip according to an embodiment of the invention. FIG. 2 is a perspective view as being cut along the 2-2 line of FIG. 1. Although not shown, a number of elements and wirings are formed on and in a silicon substrate 11. Its surface is covered by an insulation film 12, and pads 13i are provided thereon. FIG. 1 merely shows a portion of a pad 13a to be adjusted in impedance and its neighboring pad 13b.

The pad 13a is connected to a signal wiring 17a formed in a bus line region 17 as shown in FIG. 1. In the embodiment shown here, a capacitor-forming conductor 14 continuous from the pad 13a is formed to surround the pad 13a over approximately ¾ of a full circle for adjustment of the capacitance of the pad 13a. A VSS conductor 15 continuous to one of two source lines, VCC line and VSS line (VSS line in this example) in a space between the pad 13a and the capacitor-forming conductor 14. The VSS conductor 15 is formed to encircle the capacitor-forming conductor 14.

In this embodiment, the pad capacitance can be increased by using the space around the pad 13a, unlike the conventional way in which the capacitor is disposed between the pad 13a and the signal wiring 17a connected thereto or under the signal wiring 17a. Therefore, in the embodiment shown here, another signal wiring 17b and any others formed in the bus line region 17 are not affected substantially. Moreover, since the embodiment uses the portion around the pad which is not used normally, the basic layout need not be changed.

In FIG. 1, the area shown by the dot-and-dash line is a prohibit region 18 where wiring should be prohibited according to a design rule. In the embodiment shown here, the capacitor-forming conductor 14 and the VSS conductor 15 are disposed outside the prohibit region 18. Therefore, also the design rule need not be changed.

Figure 3A:
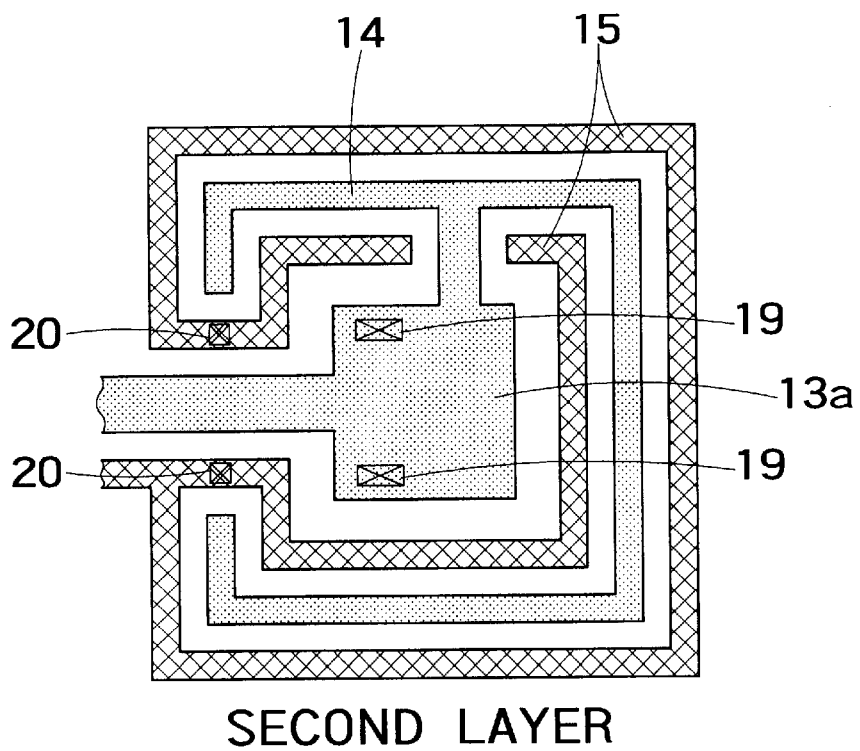
FIGS. 3A and 3B are diagrams showing patterns of first-layer conductors and second-layer conductors around a pad in a DRAM chip according to a further embodiment of the invention.
Figure 3B:
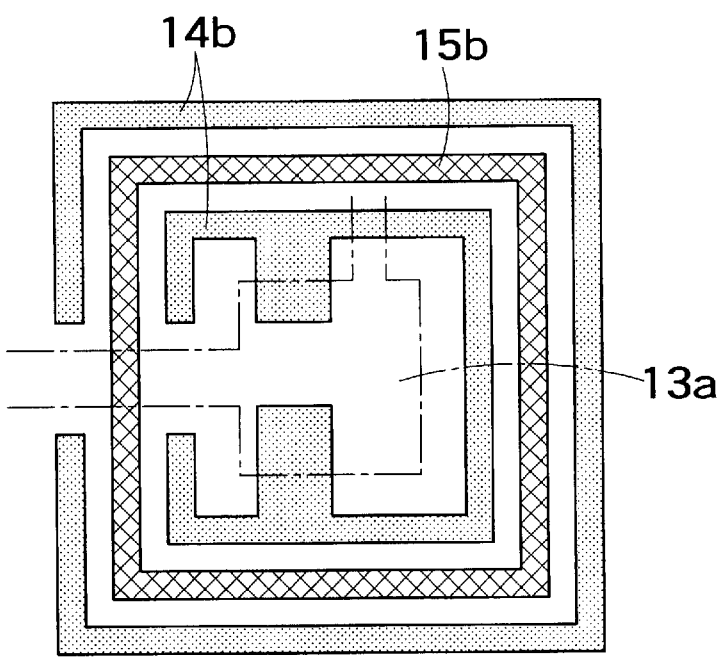

FIGS. 3A and 3B show a layout of a first layer (lower layer) and a layout of a second layer (upper layer) in another embodiment in which the capacitance adjustment of the foregoing embodiment is realized in a device with a multi-layered structure. The second layer shown in FIG. 3A exhibits substantially the same pattern as that of the foregoing embodiment, and the capacitor-forming conductor 14 and the VSS conductor 15 are formed around the pad 13a. The second layer shown in FIG. 3A is formed so that its layout overlies the layout of the first layer via an inter-layer insulation film (not shown), locating capacitor-forming conductors 14 and a VSS conductor 15 to exhibit a pattern inverted from that of the first layer. In other words, the capacitor-forming conductors 14 of the second layer are in alignment with VSS conductors 15b of the first layer substantially over the full lengths thereof, and the VSS conductors 15 of the second layer are in alignment with the capacitor-forming conductors 14b of the first layer substantially over the full lengths thereof.

The capacitor-forming conductors 14 and 14b of respective layers are connected together and the VSS conductors 15 and 15b of respective layer are connected together by contacts 19 and 20, respectively.

In the embodiment shown here, the capacitor-forming conductor 14 is in capacitor coupling with the VSS conductors 15 and 15b in horizontal and vertical directions whereas the capacitor-forming conductors 14b are in capacitance coupling with the VSS conductors 15 and 15b in horizontal and vertical directions. Therefore, a larger capacitance can be added to the pad 13a than the foregoing embodiment.

Figure 4:
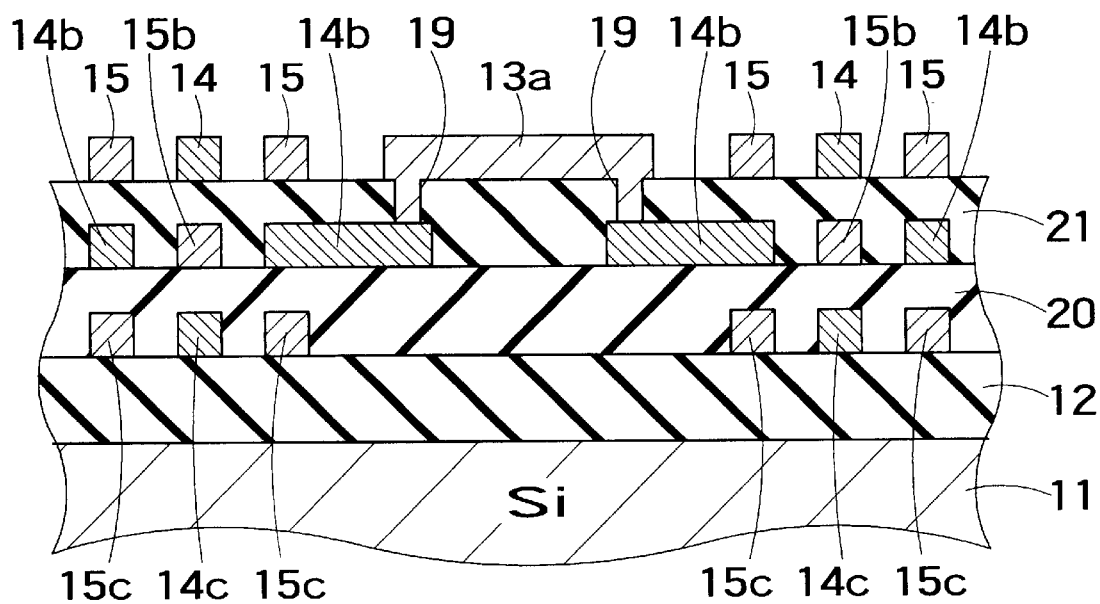
FIG. 4 is a digram showing a cross-sectional structure of a DRAM chip according to a still further embodiment of the invention.

FIG. 4 is an embodiment modified from the embodiment shown in FIGS. 3A and 3B to adjust the capacitance of a device having conductor patterns in three layers. The capacitor-forming conductor 14 and VSS conductors 15 forming the upper pattern in the embodiment of FIGS. 3A and 3B form a third layer in the embodiment shown here, the capacitor-forming conductors 14b and the VSS conductor 15b thereunder form the second layer, and a capacitor-forming conductor 14c and VSS conductors 15c forming the first layer are made thereunder. Similarly to the embodiment of FIGS. 3A and 3B, the capacitor-forming conductors 14b and the VSS conductor 15b of the second layer make a pattern approximately inverted from the pattern made by the capacitor-forming conductor 14 and the VSS conductors 15 of the third layer, and the capacitor-forming conductor 14c and the VSS conductors 15c of the first layer make the same pattern as that of the capacitor-forming conductor 14 and the VSS conductors 15 of the third layer. The layers are separated by inter-layer insulation films 20 and 21, and conductors of vertically adjacent layers are connected by contacts 19. Only two contacts 19 appear in the cross-sectional view of FIG. 4, but corresponding conductors are similarly connected between respective layers.

In the embodiment shown here, a larger capacitance can be added to the pad 13a.

In the embodiments shown in FIGS. 3A, 3B and FIG. 4, the value of the capacitance to be added to the pad 13a can be adjusted by selecting contact holes to be made for applying contacts between respective layers. If a contact hole is not made, then the capacitor-forming conductor of a lower layer becomes a useless pattern. Nevertheless, the VSS conductor in the lower layer still contributes to an increase of the capacitance. In this manner, the embodiment shown here is advantageous in that the pad capacitance can be changed only by changing the design of contact holes.

Figure 5:
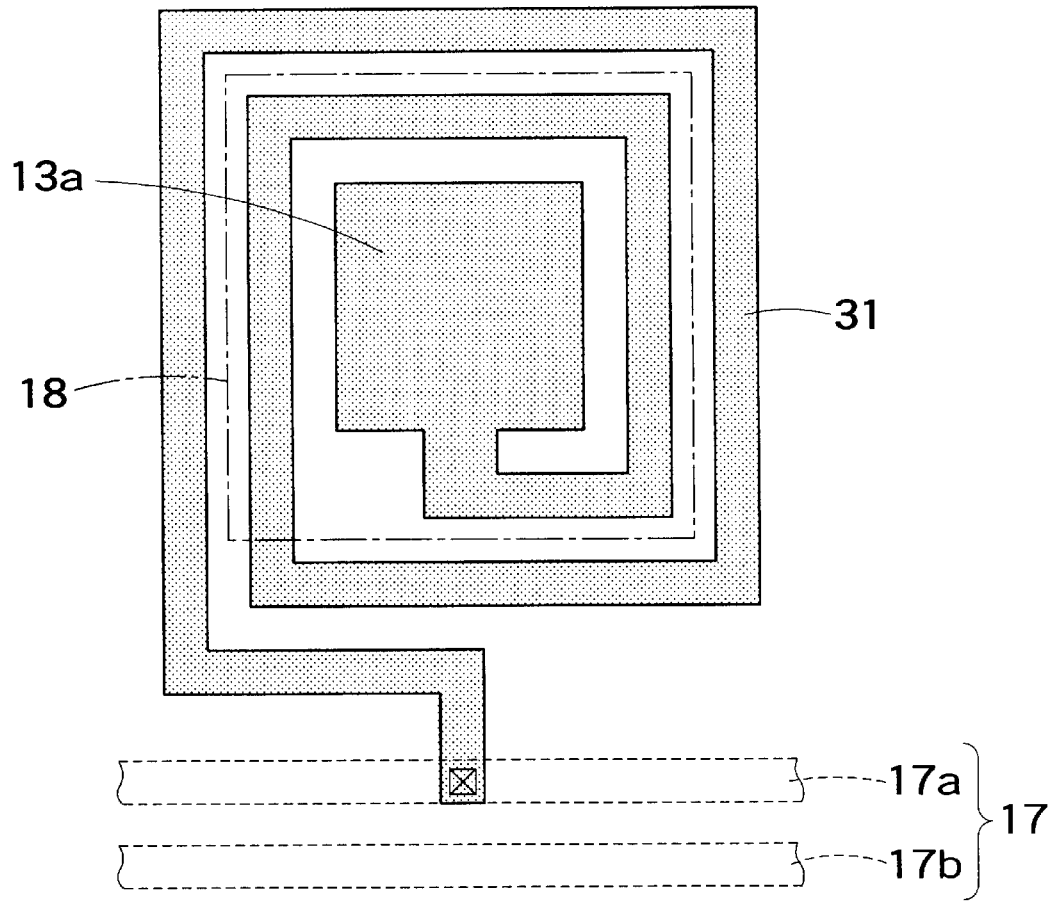
FIG. 5 is a diagram showing a pattern of conductors around a pad in a DRAM chip of a yet further embodiment of the invention.

FIG. 5 shows another embodiment of the invention exhibiting a layout of an example in which a resistor is connected between the particular pad 13a and the signal wiring 17a connected thereto. In the embodiment shown here, the pad 13a and the signal wiring 17a are connected by a spiral resistor-forming conductor 31 formed to surround the pad 13a.

According to the embodiment shown here, another signal wiring 17b and others formed in the bus line region 17 are not affected substantially. Additionally, since a normally unused space (dead space) around the pad is utilized, the resistor can be inserted and connected to the pad 13a without changing the design of the basic layout.

FIG. 5 illustrates an example in which a part of the resistor-forming conductor 31 lies within the prohibit region 18. However, even when the resistor-forming conductor 31 is short-circuited to the pad 13a in this manner, it is acceptable and not an essential defect. In this case, however, the design rule must be changed. When an ample space for making the resistor-forming conductor 31 exists between pads or between the row of pads and the bus line region, the resistor-forming conductor 31 had better be made to lie only outside the prohibit region 18 because the design rule need not be changed.

Figure 6:
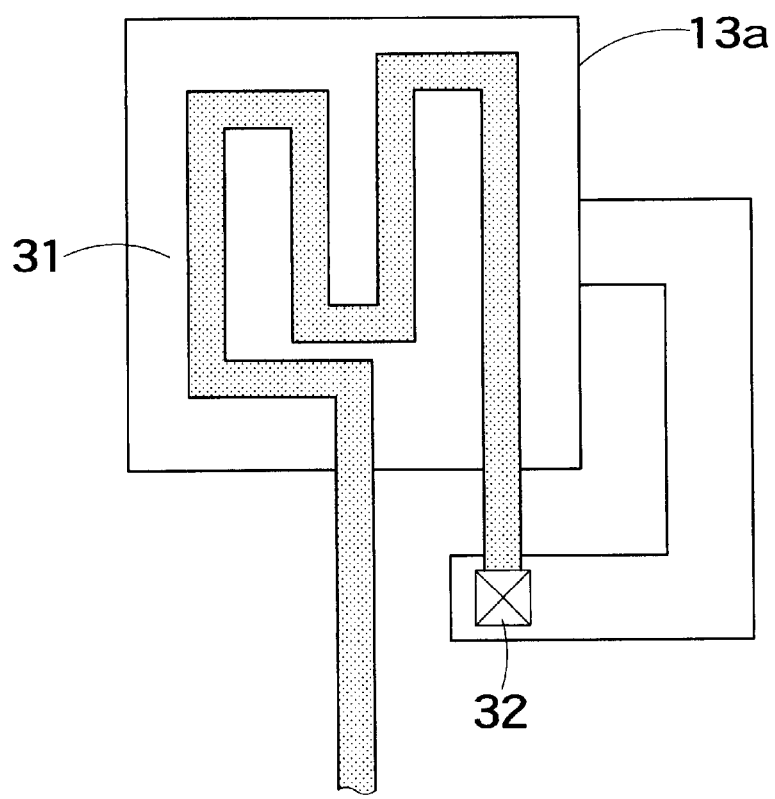
FIG. 6 is a diagram showing a pattern of conductors around a pad in a DRAM chip according to another embodiment of the invention.

FIG. 6 shows an embodiment modified from the embodiment of FIG. 5 by making the pad 13a and the resistor-forming conductor 31 in different layers. Namely, the pad 13a is made as a conductor in the top layer, and the resistor-forming conductor 31 is made in a lower layer insulated from the upper layer by an inter-layer insulation film. In this case, the resistor-forming conductor 31 exhibits an inwardly spiral pattern partly overlapping the pad 13a when viewed in the plan view. Then, the resistor-forming conductor 31 is connected to the pad 13a by a contact 32 at a central portion of the spiral of the resistor-forming conductor.

According to the embodiment, a large resistor can be inserted and connected to the pad in a smaller space than that of the embodiment shown in FIG. 5 by utilizing the area overlapping the pad 13a when viewed in its plan view.

Figure 7:
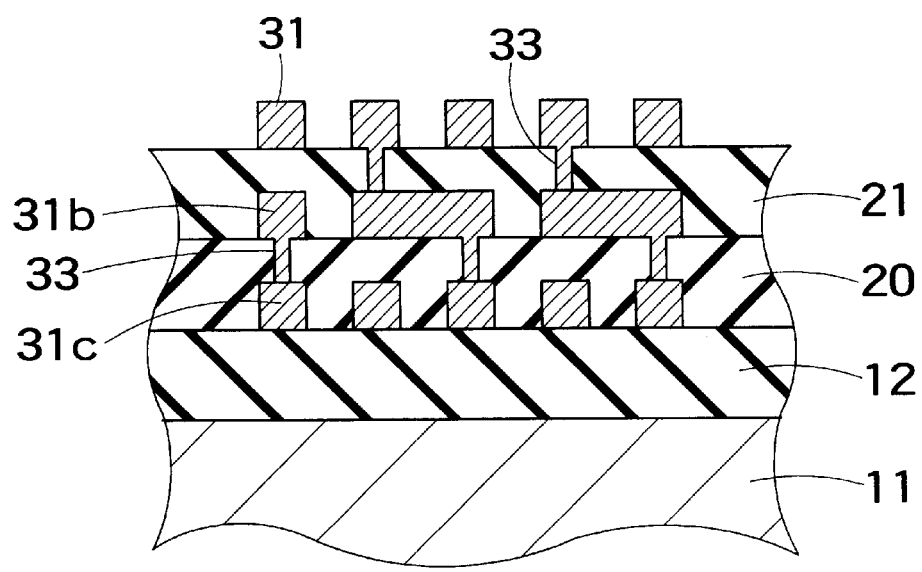
FIG. 7 is a diagram showing a cross-sectional structure of a DRAM chip according to another embodiment of the invention.

Furthermore, the spiral resistor-forming conductor 31 may have a multi-layered structure. FIG. 7 shows an embodiment in form of a three-layered structure. Each of the resistor-forming conductor 31 of the top layer (third layer), resistor-forming conductor 31b of the second layer and resistor-forming conductor 31c of the first layer has a spiral pattern as explained with the preceding embodiment, and they are stacked via inter-layer insulation films 20 and 21. These resistor-forming conductors 31, 31b and 31c are sequentially connected in series by contacts 33, and are inserted and connected between the pad and the signal wiring.

Figure 8A:
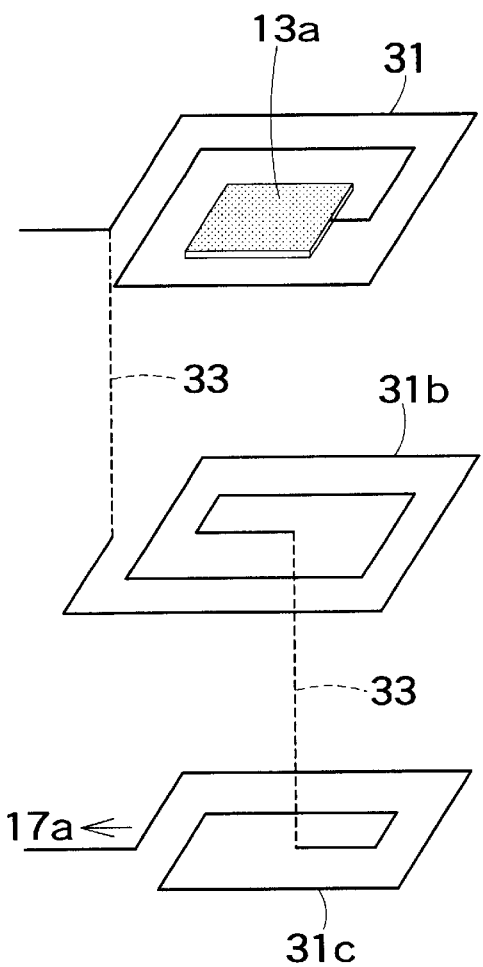
FIGS. 8A and 8B are schematic, exploded, perspective views showing inter-layer connected relations of the embodiment show in FIG. 7.
Figure 8B:
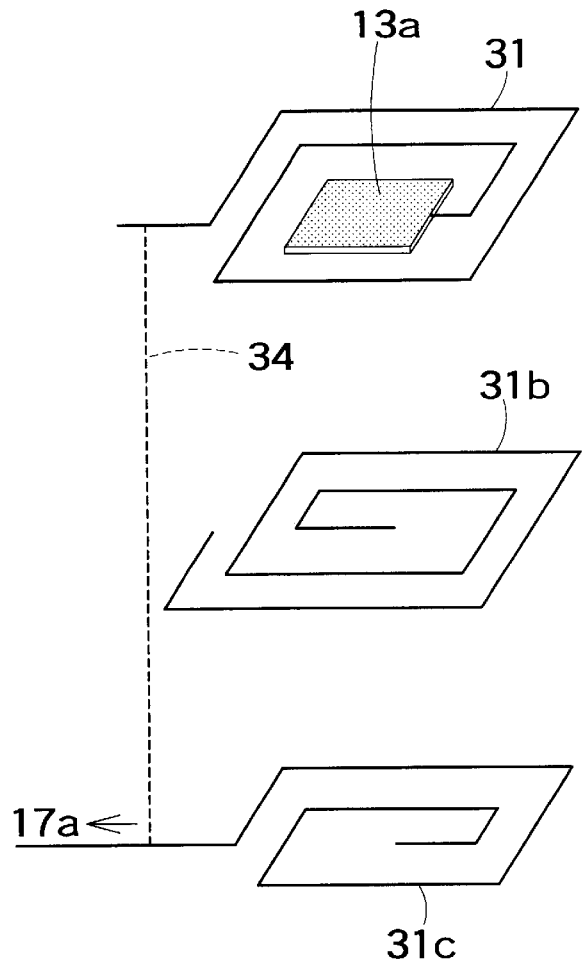

FIGS. 8A and 8B show examples of mutual connection of patterns of three-layered resistor-forming conductors 31, 31b and 31c in the embodiment of FIG. 7 in schematic, exploded, perspective views.

According to the embodiment, a larger resistance than that of the preceding embodiment can be inserted and connected to the pad.

Consequently, in case that resistor-forming conductors are stacked in some different layers, the resistance value to be inserted and connected can be changed by changing the design of contact holes in the same manner as the embodiment using capacitor-forming conductors. For example, when contacts 33 are made in all inter-layer insulation films as shown in by broken lines in FIG. 8A, resistor-forming conductors 31, 31b and 31c connected in series can be inserted and connected between the pad 13a and the signal wiring 17a therefor. In contrast, when the resistor-forming conductor 31 of the third layer is connected directly to the signal wiring 17a by another contact 34 without providing the contacts 33 as shown in FIG. 8B, a smaller resistance value can be inserted and connected. In this case, the resistor-forming conductors 31b and 31c remain as useless patterns. Also this embodiment is advantageous in that the resistance value to be inserted to the pad can be adjusted appropriately merely by changing the design of contacts.

Figure 9:
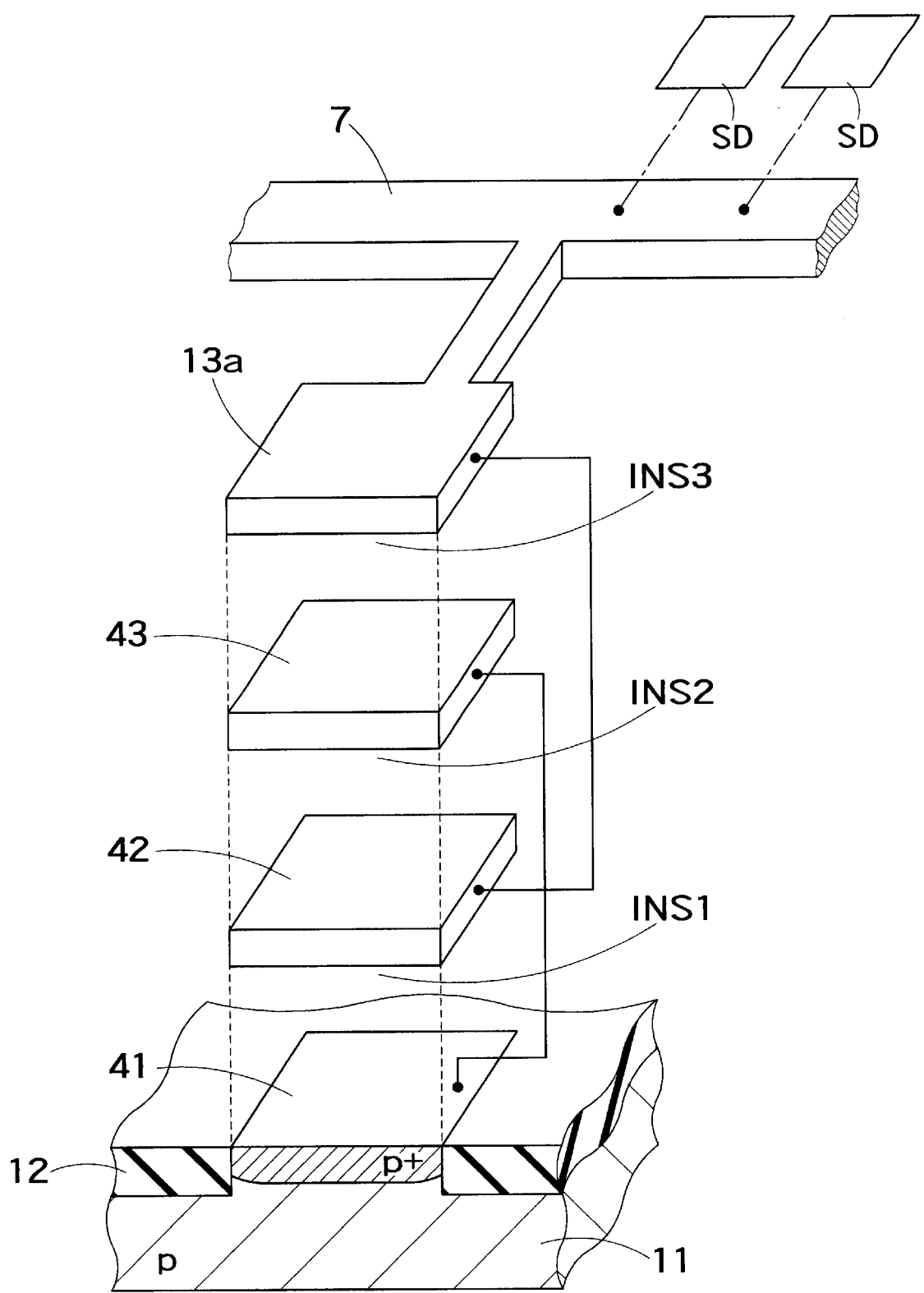
FIGS. 9 and 9A are schematic, exploded, perspective view of a DRAM chip according to another embodiment of the invention.

FIG. 9 is a schematic, exploded, perspective view showing a central part of an embodiment which can increase the pad capacitance, requiring no substantial area other than the pad portion. Formed on the surface of a substrate 11 under the particular pad 13a is a $p^+$-type diffusion layer 41 to be set in a potential VSS. Stacked on the $p^+$-type diffusion layer 41 is a capacitor-forming conductor 42 via an inter-layer insulation film INS1, and further stacked thereon is a VSS conductor 43 via an inter-layer insulation film INS2. Formed thereon is the pad 13a via an inter-layer insulation film INS3. The $p^+$-type diffusion layer 41 and the VSS conductor 43 are connected to each other, and the pad 13a and the capacitor-forming conductor 42 are connected to each other. FIG. 9 schematically shows these connections in simple lines. Actually, however, they are connected by contacts, not shown, in regions outside the pad 13a. Each of the $p^+$-type diffusion layer 41, capacitor-forming conductor 42 and VSS conductor 43 is approximately equal in area to the pad 13a.

Figure 9A:
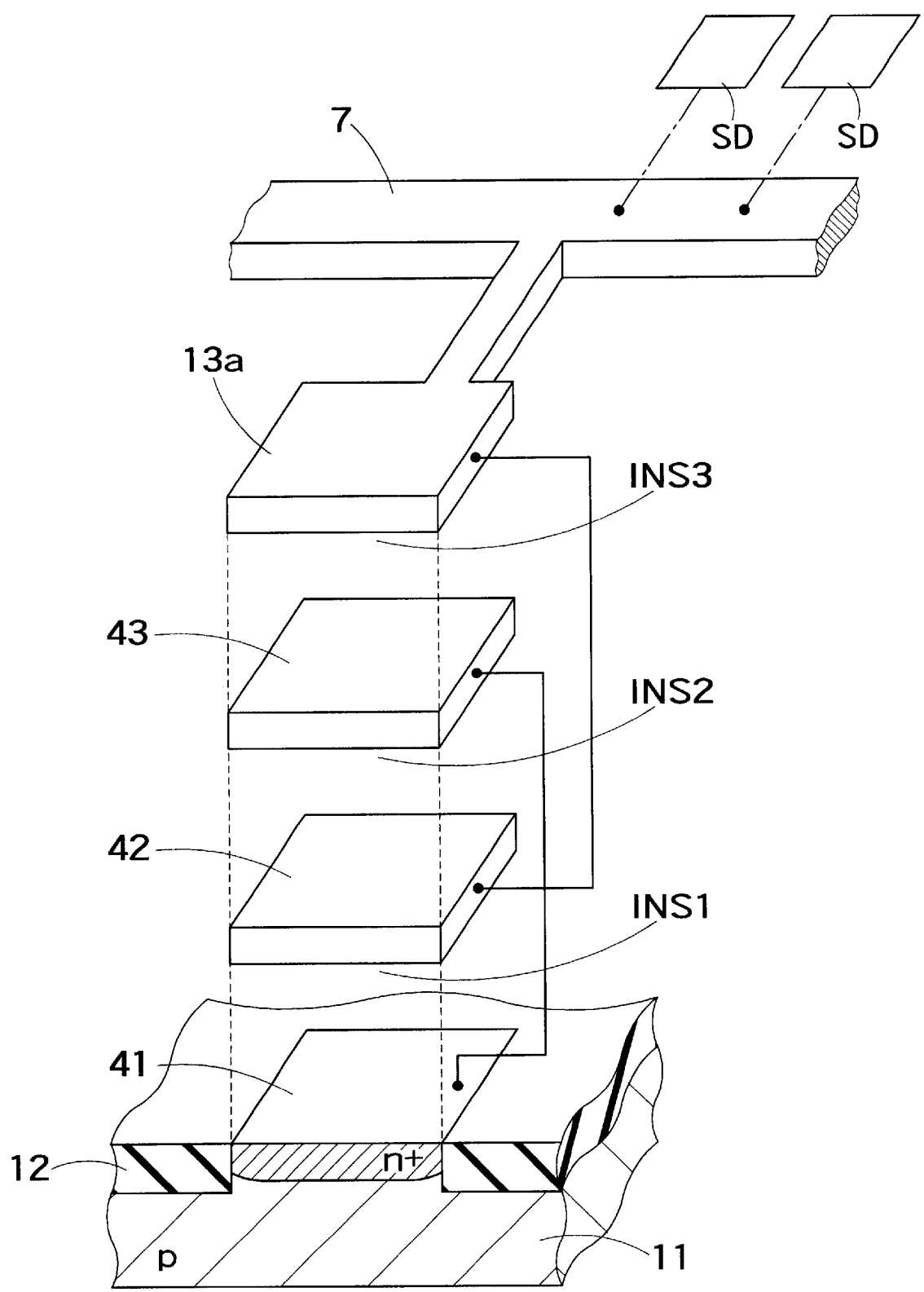

According to the embodiment shown here, since the capacitor-forming conductor 42 is in capacitance coupling with the VSS conductor 43 and the $p^+$-type diffusion layer 41 above and below it, and the pad 13a is in capacitance coupling with the VSS conductor 43 thereunder, it results in inserting and connecting a large capacitance to the pad 13a. Also this embodiment needs substantially no increase in area, and it is suitable for applications with very small spaces between pad rows. FIG. 9A is another embodiment where the type of diffusion layer 41 is $n^+$-type.

The embodiment shown in FIG. 1 has been explained as making the pattern to turn around the pad 13a by only (¾)+α of a full turn for the purpose of preventing the capacitor-forming conductor 14 from overlapping the VSS conductor 15. However, if a smaller value is acceptable as the capacitance to be added, the pattern may be shorter. It will be difficult, however, to add a practically sufficient capacitance with an excessively short pattern, and the pattern of the capacitor-forming conductor is preferably made to turn around the pad 13a by at least a half of a full turn.

Figure 10:
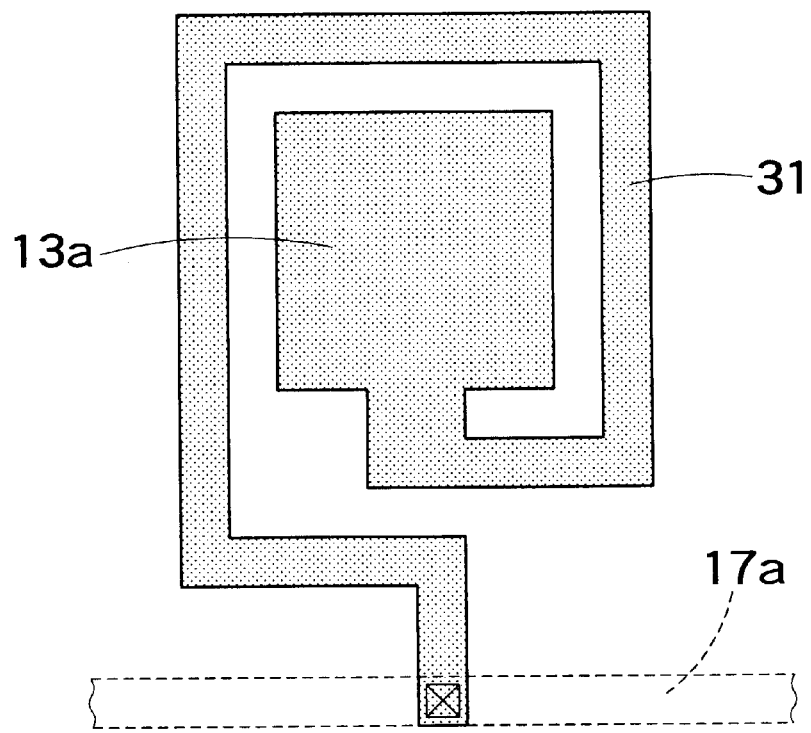
FIG. 10 is a diagram showing a layout of an embodiment modified from the embodiment of FIG. 5.
Figure 11:
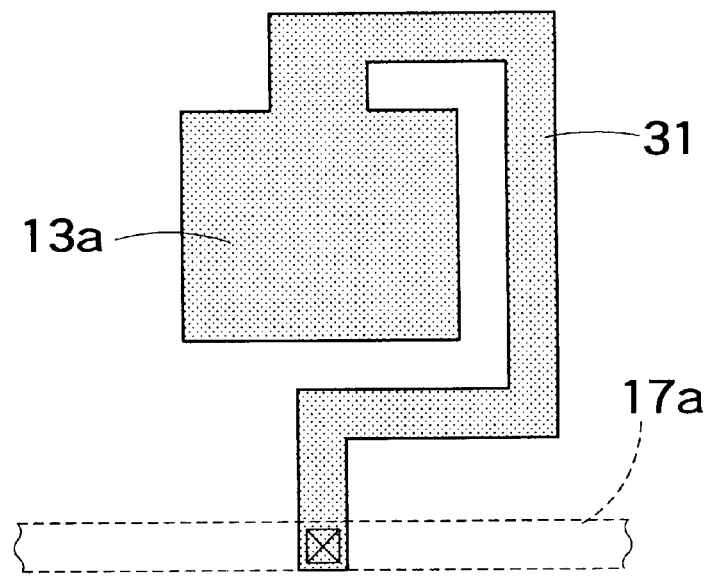
FIG. 11 is a diagram showing a layout of an embodiment modified from the embodiment of FIG. 5.

The same also applies to the resistor-forming conductor 31 in the embodiments shown in FIG. 5, et seq. In FIG. 5, for example, the resistor-forming conductor 31 has a spiral pattern making two turns around the pad 13a; however, a spiral pattern making one turn around the pad as shown in FIG. 10 is acceptable, and a small resistance value can be added with a pattern making at least a half turn around the pad 13a as shown in FIG. 11.

Figure 12:
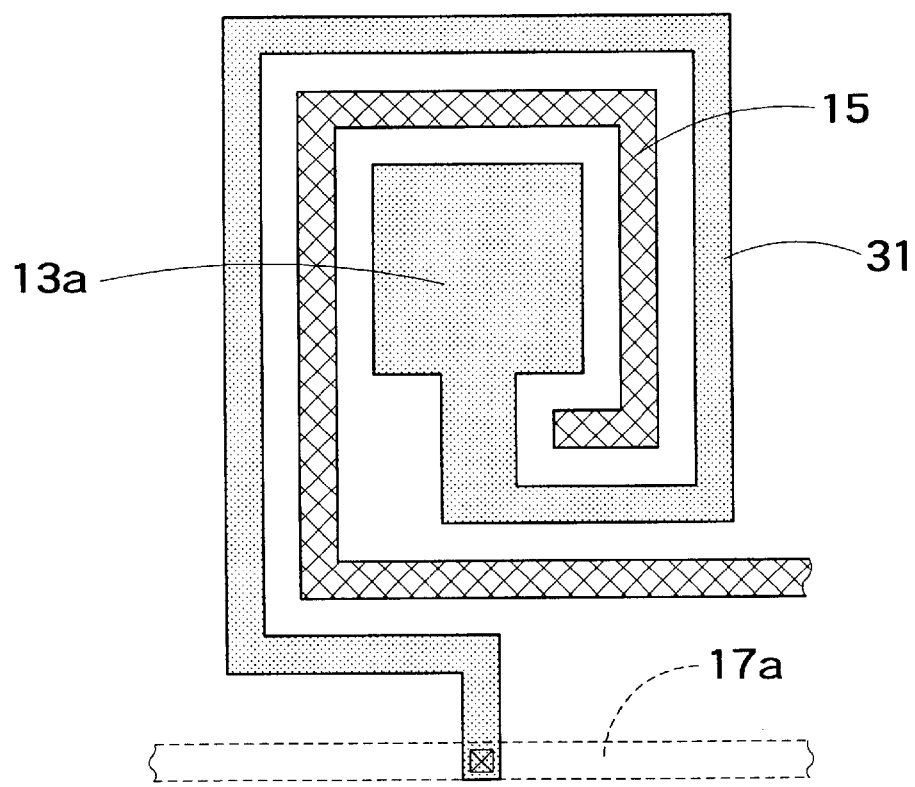
FIG. 12 is a diagram showing a layout of an embodiment modified from the embodiment of FIG. 10.
Figure 13:
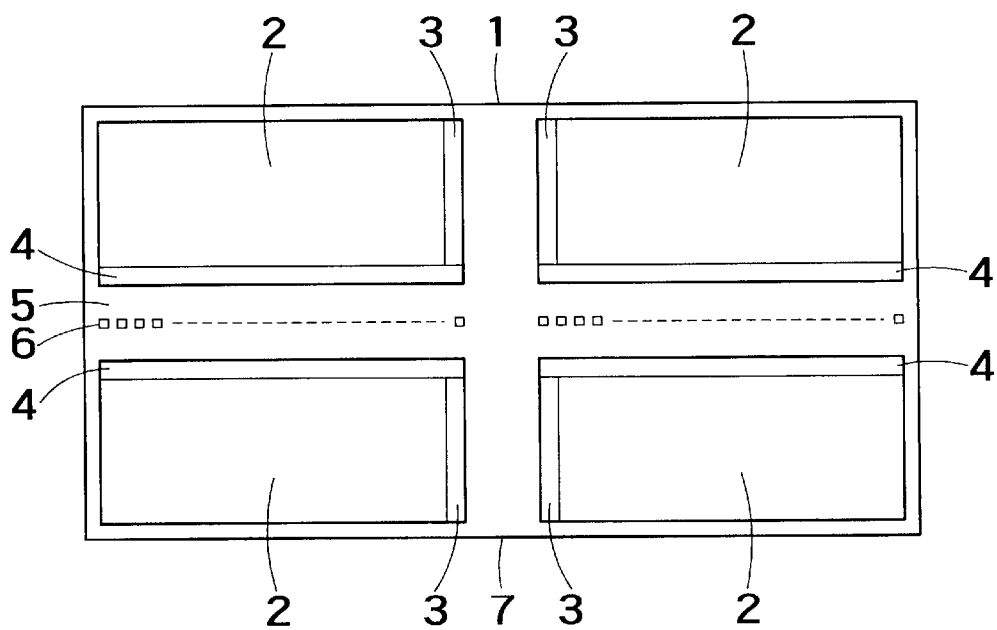
FIG. 13 is a diagram showing a rough layout of a conventional DRAM chip.
Figure 14:
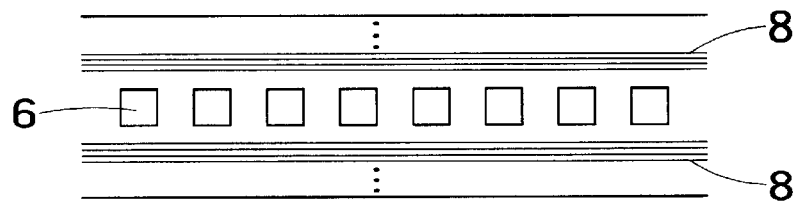
FIG. 14 is a diagram showing a layout of a row of pads and bus line regions adjacent thereto in the conventional DRAM chip of FIG. 13.
Figure 15:
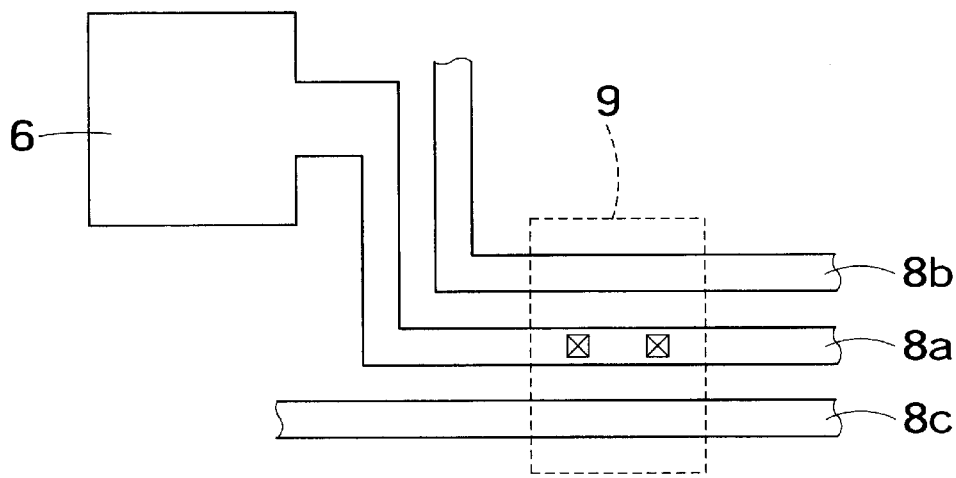
FIG. 15 is a diagram showing a mode of adjustment of capacitance of a pad in a conventional LSI.
Figure 16:
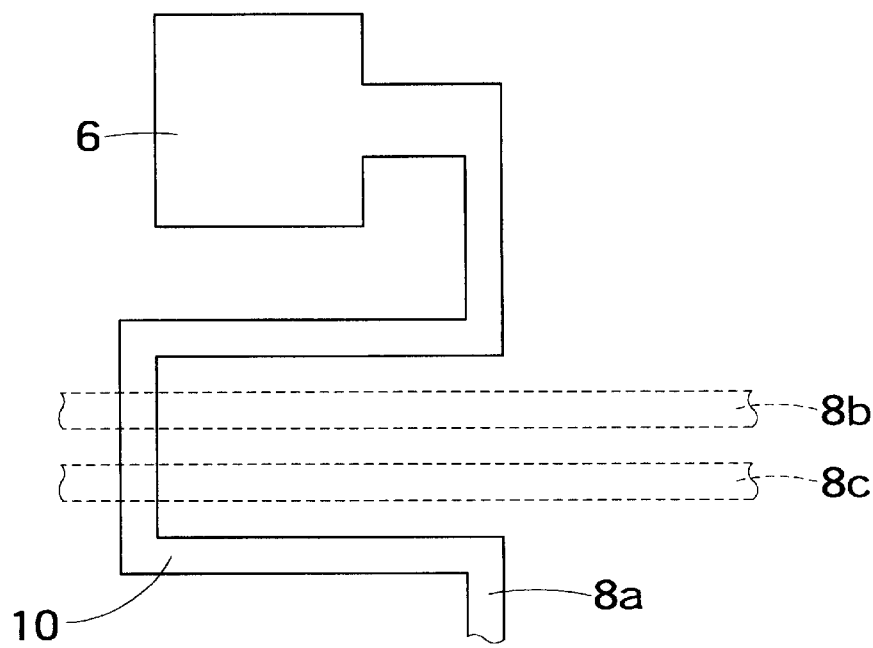
FIG. 16 is a diagram showing a mode of adjustment of resistance of a pad in a conventional LSI.

The invention is applicable also when adding both a resistance and a capacitance simultaneously. For example, FIG. 12 shows an embodiment based on the layout of FIG. 10 and additionally providing the VSS conductor 15 in the space between the resistor-forming conductor 31 and the pad 13a similarly to the embodiment of FIG. 1. In this manner, both a resistor and a capacitor can be added to the pad 13a.

All above embodiments have been explained, a capacitance or a resistance are added around a particular single pad thereto. However, by previously making similar impedance adjustment patterns also for other pads, skew by delays in signal wirings can be remedied more easily.

The invention is applicable all kinds of LSIs not limited to DRAMs.

As described above, by making an impedance adjustment pattern, such as capacitor-forming conductor and resistor-forming conductor, so as to surround a particular pad, the impedance of the particular pad, the invention realizes an LSI in which the impedance of the particular pad can be adjusted without affecting impedances of bus lines close to the row of pads or without changing the layout.

What is claimed is:

1. A semiconductor integrated circuit device including semiconductor elements, signal wirings and pads each formed on a semiconductor substrate so as to connect one of said semiconductor elements to one of said signal wirings and to connect said signal wiring to one of said pads, comprising:

a capacitor-forming conductor made in a top layer, arranged around said pad to surround said pad and connected to said pad; and a first capacitance-coupling conductor made in the top layer between said pad and said capacitor-forming conductor and brought into capacitance coupling with said pad and said capacitor-forming conductor, respectively, wherein said semiconductor integrated circuit device further comprises a second capacitance-coupling conductor made in the top layer outside said capacitor-forming conductor and brought into capacitance coupling with said capacitor-forming conductor, and said first and second capacitance-coupling conductors are connected to each other, and said first capacitance-coupling conductor, said capacitor-forming conductor and said second capacitance-coupling conductor are arranged around said pad in an order from inner side to outer side, said first capacitance-coupling conductor having a first cut section and a second cut section, said capacitor-forming conductor having a third cut section and said second capacitance-coupling conductor having a fourth cut section, said second cut section, said third cut section and said fourth cut section being arranged in line, said pad having a connecting conductor and an outer line connecting conductor, both of which protruding in a radial pattern, respectively, said connecting conductor being arranged in said first cut section and connecting said pad to said capacitor-forming conductor, said outer line connecting conductor being arranged in said second, third and fourth cut sections and extending to the outer side of said second capacitance-coupling conductor, wherein one end of said second cut section of said first capacitance-coupling conductor and one end of said fourth cut section of said second capacitance-coupling conductor being connected to each other through said third cut section, and the other end of said second cut section of said first capacitance-coupling conductor and the other end of said second capacitance-coupling conductor being connected to each other through said third cut section.

2. The semiconductor integrated circuit device according to claim 1, wherein said first and second capacitance-coupling conductors are connected to a power source line of a lower voltage.

3. The semiconductor integrated circuit device according to claim 1, which has a multi-layered structure including a first layer as the bottom layer, an Nth layer as the top layer, and an insulation film between every two vertically adjacent layers, said Nth layer including said capacitor-forming conductor of the top layer and said first and second capacitance-coupling conductors of the top layer, each of (N−1)th to first layers having said capacitor-forming conductor for a lower layer and said first and second capacitance-coupling conductors for the lower layer, every two layers vertically adjacent to each other having patterns of said capacitor-forming conductors and said capacitance-coupling conductors inverted from each other so as to confront the pattern of said capacitor-forming conductor of a Pth layer with said capacitance-coupling conductors of a (P−1)th layer that is vertically adjacent to said Pth layer via said insulation film and to confront said capacitance-coupling conductors of the Pth layer with said capacitor-forming conductor of the (P−1)th layer via said insulation film, said capacitor-forming conductors of vertically adjacent two of said layers being connected to each other, and said capacitance-coupling conductors of vertically adjacent two of said layers being connected to each other.

4. A semiconductor integrated circuit device comprising a semiconductor substrate having a plurality of elements, signal wirings connecting these elements, a plurality of pads for connecting one or more of the signal wirings to one or more external pins formed on said semiconductor substrate, and at least one impedance adjusting conductor pattern made to surround one of said pads and connected to said pad, wherein said impedance adjusting conductor pattern is a capacitor-forming conductor, and a first power source line conductor is inserted in a space between said capacitor-forming conductor and said one of said pads, which first power source line conductor is capacitance-coupled with said capacitor-forming conductor and said pad, wherein the semiconductor integrated circuit device further comprises a second power source line conductor arranged outside of said capacitor-forming conductor and in capacitance coupling with said capacitor-forming conductor, and said first an second power source line conductors are connected, and wherein combination patterns of said power capacitor-forming conductor and said first and second power source line conductors are made in each layer, adjacent combination patterns being formed via each insulation layer, patterns of said capacitor-forming conductors and said first and second power source line conductors being inverted between adjacent layers, said capacitor-forming conductors of different layers being connected to each other, said first power source line conductors and second power source line conductors of different layers being connected to each other, respectively, and said capacitor-forming conductor of each layer being brought into capacitance coupling with said first and second power source line conductors of horizontally and vertically adjacent layers.

5. A semiconductor integrated circuit device comprising a semiconductor substrate having a plurality of elements, signal wirings connecting these elements, a plurality of pads for connecting one or more of the signal wirings to one or more external pins formed on said semiconductor substrate, and at least one impedance adjusting conductor pattern made to surround one of said pads and connected to said pad, wherein said impedance adjusting conductor pattern is a capacitor-forming conductor, and a first power source line conductor is inserted in a space between said capacitor-forming conductor and said one of said pads, which first power source line conductor is capacitance-coupled with said capacitor-forming conductor and said pad, wherein the semiconductor integrated circuit device further comprises a second power source line conductor arranged outside of said capacitor-forming conductor and in capacitance coupling with said capacitor-forming conductor, and said first an second power source line conductors are connected, and wherein the semiconductor integrated circuit device further comprises a plurality of layers each forming said impedance adjusting conductor pattern via an insulation film such that the value of impedance adjustment is controlled by making or not making contacts between said impedance adjusting patterns in different layers.

* * * * *